US 8,058,922 B2
Nov. 15, 2011

(12) United States Patent
Cassia

(54) SWITCH WITH IMPROVED BIASING

(75) Inventor: Marco Cassia, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 21 days.

(21) Appl. No.: 12/623,197

(22) Filed: Nov. 20, 2009

(65) Prior Publication Data

US 2011/0025403 A1 Feb. 3, 2011

Related U.S. Application Data

(60) Provisional application No. 61/229,246, filed on Jul. 28, 2009.

(51) Int. Cl.
*H03K 3/01* (2006.01)

(52) U.S. Cl. ......... 327/534; 327/308; 327/382; 333/103

(58) Field of Classification Search .................. 327/308, 327/534, 382; 333/103
See application file for complete search history.

(56) References Cited

U.S. PATENT DOCUMENTS

| | | | |
|---|---|---|---|
| 6,094,088 A | | 7/2000 | Yano |
| 6,836,172 B2* | | 12/2004 | Okashita ..................... 327/382 |
| 6,870,241 B2* | | 3/2005 | Nakatani et al. ............. 257/531 |
| 7,173,471 B2* | | 2/2007 | Nakatsuka et al. ........... 327/308 |
| 7,205,817 B1* | | 4/2007 | Huang et al. ................. 327/308 |
| 7,263,337 B2* | | 8/2007 | Struble ............................ 455/78 |
| 7,345,521 B2* | | 3/2008 | Takahashi et al. ............ 327/308 |
| 7,459,988 B1* | | 12/2008 | Iversen ......................... 333/103 |
| 7,659,770 B2* | | 2/2010 | Teraguchi et al. ............ 327/534 |
| 7,843,280 B2* | | 11/2010 | Ahn et al. ..................... 333/103 |
| 7,848,712 B2* | | 12/2010 | Fu et al. .......................... 455/80 |
| 7,877,058 B2* | | 1/2011 | Prikhodko et al. .......... 455/13.3 |
| 2004/0051395 A1 | | 3/2004 | Brindle et al. |
| 2005/0014473 A1 | | 1/2005 | Zhao et al. |

OTHER PUBLICATIONS

International Search Report and Written Opinion—PCT/US2010/043596, International Search Authority—European Patent Office—Sep. 23, 2010.

* cited by examiner

*Primary Examiner* — Kenneth B. Wells
(74) *Attorney, Agent, or Firm* — Ramin Mobarhan

(57) ABSTRACT

Switches with improved biasing and having better isolation and reliability are described. In an exemplary design, a switch is implemented with a set of transistors, a set of resistors, and an additional resistor. The set of transistors is coupled in a stacked configuration, receives an input signal, and provides an output signal. The set of resistors is coupled to the gates of the set of transistors. The additional resistor is coupled to the set of resistors and receives a control signal for the set of transistors. The resistors reduce signal loss through parasitic capacitances of the transistors when they are turned on. The resistors also help split the signal swing of the input signal approximately evenly across the transistors when they are turned off, which may improve reliability of the transistors. The switch may be used in a switchplexer, a power amplifier (PA) module, etc.

20 Claims, 6 Drawing Sheets

US 8,058,922 B2

SWITCH WITH IMPROVED BIASING

CLAIM OF PRIORITY UNDER 35 U.S.C. §119

The present application for patent claims priority to Provisional U.S. Application Ser. No. 61/229,246, entitled "SWITCH BIASING TOPOLOGY," filed Jul. 28, 2009, assigned to the assignee hereof, and expressly incorporated herein by reference.

BACKGROUND

I. Field

The present disclosure relates generally to electronics, and more specifically to switches.

II. Background

Switches are commonly used in various electronics circuits such as a transmitter in a wireless communication device. Switches may be implemented with various types of transistors such as metal oxide semiconductor (MOS) transistors. A switch may receive an input signal at one source/drain terminal and a control signal at a gate terminal. The switch may pass the input signal to the other source/drain terminal if the switch is turned on by the control signal and may block the input signal if the switch is turned off by the control signal. The switch may have parasitic capacitances between its terminals, which may adversely impact the performance of the switch as described below.

DETAILED DESCRIPTION

The word "exemplary" is used herein to mean "serving as an example, instance, or illustration." Any design described herein as "exemplary" is not necessarily to be construed as preferred or advantageous over other designs.

Switches with improved biasing and having better isolation and reliability are described herein. The switches may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the switches in a wireless communication device is described below.

Figure 1:
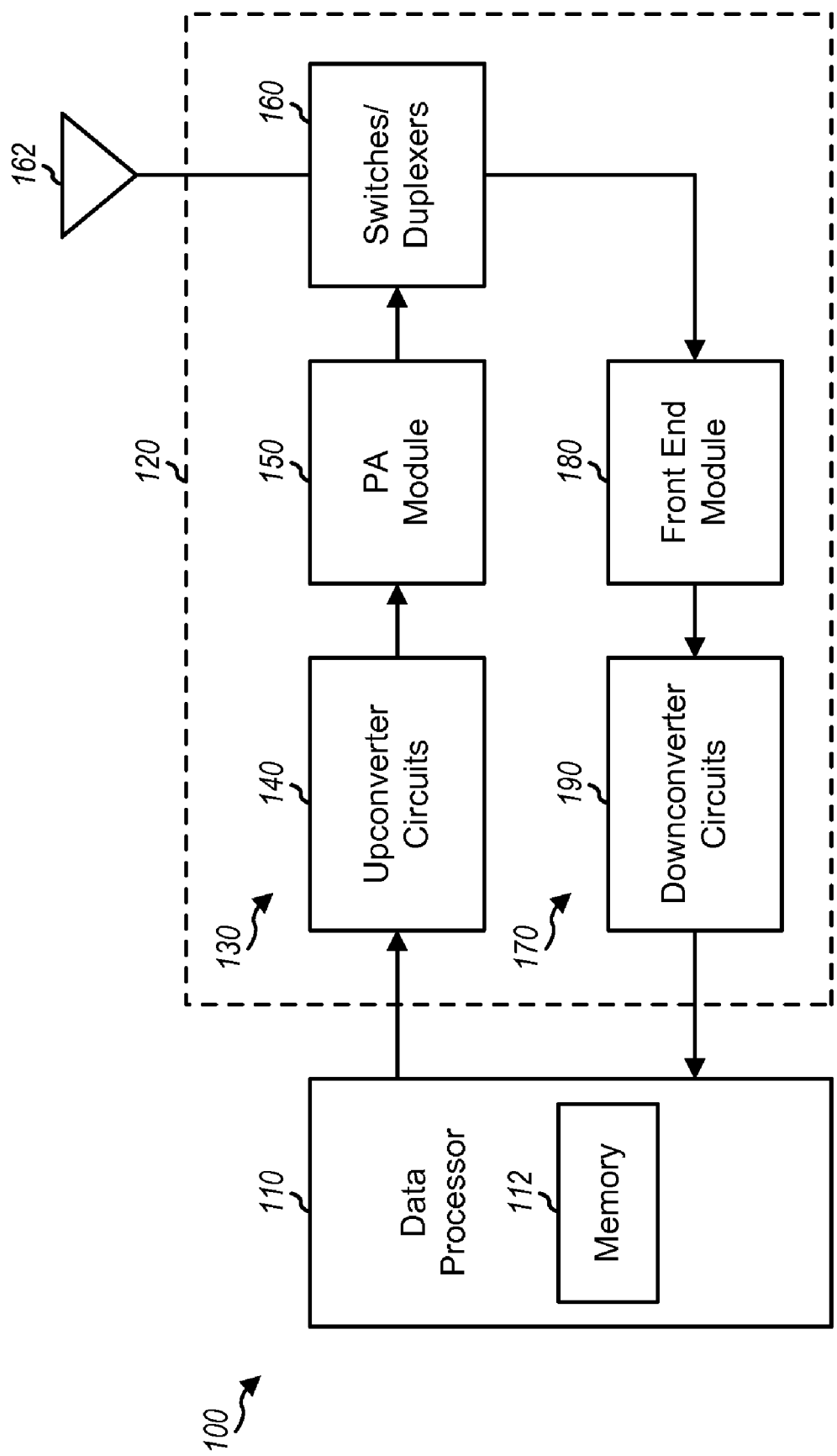
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 170 that support bi-directional communication.

In the transmit path, data processor 110 may process (e.g., encode and modulate) data to be transmitted and provide an output baseband signal to transmitter 130. Within transmitter 130, upconverter circuits 140 may process (e.g., amplify, filter, and frequency upconvert) the output baseband signal and provide an upconverted signal. Upconverter circuits 140 may include amplifiers, filters, mixers, etc. A power amplifier (PA) module 150 may amplify the upconverted signal to obtain the desired output power level and provide an output radio frequency (RF) signal, which may be routed through switches/duplexers 160 and transmitted via an antenna 162.

In the receive path, antenna 162 may receive RF signals transmitted by base stations and/or other transmitter stations and may provide a received RF signal, which may be routed via switches/duplexers 160 and provided to receiver 170. Within receiver 170, a front end module 180 may process (e.g., amplify and filter) the received RF signal and provide an amplified RF signal. Front end module 180 may include low noise amplifiers (LNAs), filters, etc. Downconverter circuits 190 may further process (e.g., frequency downconvert, filter, and amplify) the amplified RF signal and provide an input baseband signal to data processor 110. Downconverter circuits 190 may include mixers, filters, amplifiers, etc. Data processor 110 may further process (e.g., digitize, demodulate, and decode) the input baseband signal to recover transmitted data.

FIG. 1 shows an exemplary design of transmitter 130 and receiver 170. All or a portion of transmitter 130 and/or all or a portion of receiver 170 may be implemented on one or more analog ICs, RF ICs (RFICs), mixed-signal ICs, etc.

Data processor 110 may generate controls for the circuits and modules in transmitter 130 and receiver 170. The controls may direct the operation of the circuits and modules to obtain the desired performance. Data processor 110 may also perform other functions for wireless device 100, e.g., processing for data being transmitted or received. A memory 112 may store program codes and data for data processor 110. Data processor 110 may be implemented on one or more application specific integrated circuits (ASICs) and/or other ICs.

Figure 2:
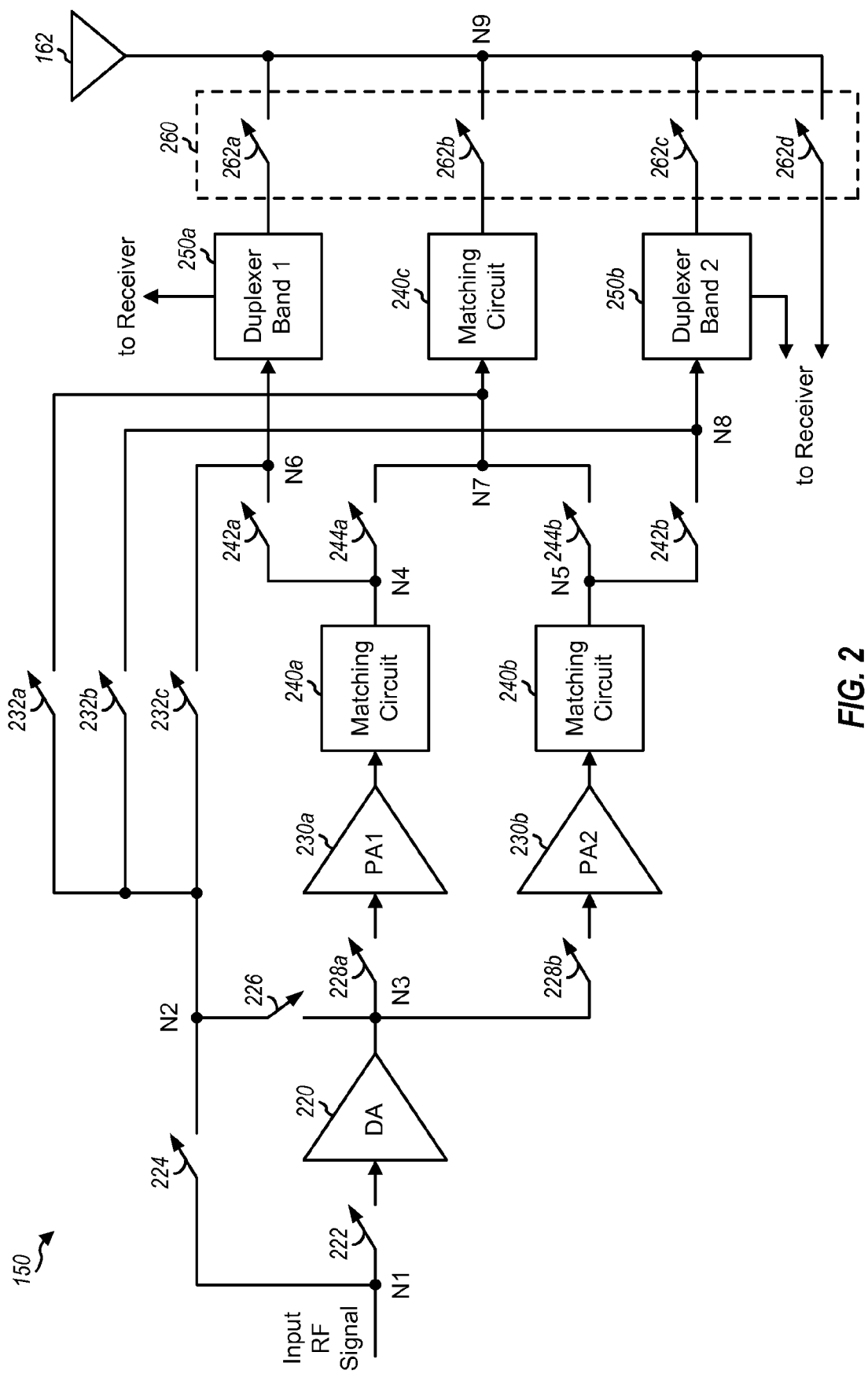
FIG. 2 shows a power amplifier (PA) module and a switchplexer.

FIG. 2 shows a block diagram of an exemplary design of PA module 150 and switches/duplexers 160 in FIG. 1. In the exemplary design shown in FIG. 2, switches/duplexers 160 include duplexers 250a and 250b and a switchplexer 260. PA module 150 includes the remaining circuits in FIG. 2.

Within PA module 150, a switch 222 is coupled between node N1 and the input of a driver amplifier (DA) 220, and the output of driver amplifier 220 is coupled to node N3. An input RF signal is provided to node N1. A switch 224 is coupled between nodes N1 and N2, and a switch 226 is coupled between nodes N2 and N3. A switch 228a is coupled between node N3 and the input of a first power amplifier (PA1) 230a, and a switch 228b is coupled between node N3 and the input of a second power amplifier (PA2) 230b. A matching circuit 240a is coupled between the output of power amplifier 230a and node N4, and a matching circuit 240b is coupled between the output of power amplifier 230b and node N5. Switches 232a, 232b and 232c have one end coupled to node N2 and the other end coupled to nodes N7, N8 and N6, respectively. Switches 242a and 244a have one end coupled to node N4 and the other end coupled to nodes N6 and N7, respectively. Switches 242b and 244b have one end coupled to node N5 and the other end coupled to nodes N8 and N7, respectively. A matching circuit 240c is coupled in series with a switch 262b, and the combination is coupled between nodes N7 and N9.

Duplexer 250a for band 1 has its transmit port coupled to node N6, its receive port coupled to a receiver (e.g., front end module 180 in FIG. 1), and its common port coupled to node N9 via a switch 262a. Duplexer 250b for band 2 has its transmit port coupled to node N8, its receive port coupled to the receiver, and its common port coupled to node N9 via a switch 262c. A switch 262d is coupled between node N9 and the receiver and may be used to support time division duplexing (TDD), e.g., for Global System for Mobile Communications (GSM). Antenna 162 is coupled to node N9.

Driver amplifier 220 may be selected/enabled to provide signal amplification or may be bypassed. Each power amplifier 230 may also be selected to provide power amplification or may be bypassed. Matching circuit 240a may provide output impedance matching for power amplifier 230a, and matching circuit 240b may provide output impedance matching for power amplifier 230b. Matching circuits 240a and 240b may each provide a target input impedance (e.g., 4 to 6 Ohms) and a target output impedance (e.g., 50 Ohms). Matching circuit 240c may provide impedance matching for matching circuits 240a and 240b when both power amplifiers 230a and 230b are enabled and switches 244a and 244b are closed. Matching circuits 240a, 240b and 240c may also provide filtering to attenuate undesired signal components at harmonic frequencies.

PA module 150 may support a number of operating modes. Each operating mode may be associated with a different signal path from node N1 to node N9 via zero or more amplifiers. One operating mode may be selected at any given moment. The signal path for the selected operating mode may be obtained by properly controlling the switches within transmitter 150. For example, a high power mode may be associated with a signal path from node N1 through switch 222, driver amplifier 220, switches 228a and 228b, power amplifiers 230a and 230b, matching circuits 240a and 240b, switches 244a and 244b, matching circuit 240c, and switch 262b to antenna 162. A medium power mode may be associated with a signal path from node N1 through switch 222, driver amplifier 220, switch 228a, power amplifier 230a, matching circuit 240a, switch 244a, matching circuit 240c, and switch 262b to antenna 162. A low power mode may be associated with a signal path from node N1 through switch 222, driver amplifier 220, switches 226 and 232a, matching circuit 240c, and switch 262b to antenna 162. A very low power mode may be associated with a signal path from node N1 through switches 224 and 232a, matching circuit 240c, and switch 262b to antenna 162. Other operating modes may also be supported.

In the exemplary design shown in FIG. 2, switches may be used to route RF signals and support multiple operating modes. The switches may be implemented with MOS transistors, transistors of other types, or other circuit components. For clarity, switches implemented with MOS transistors are described below.

Figure 3A:
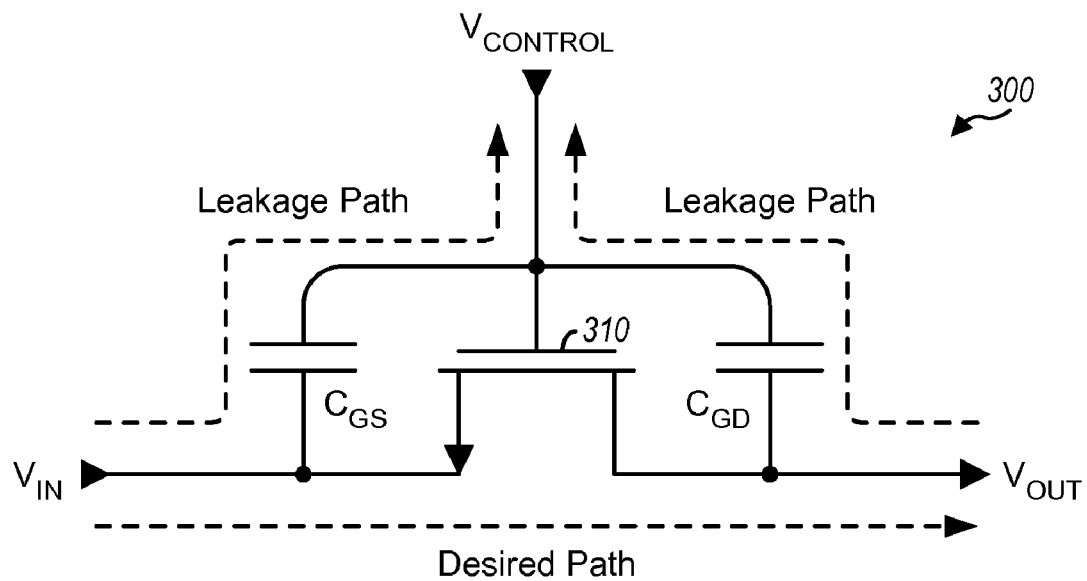
FIGS. 3A and 3B show switches implemented with MOS transistors.

FIG. 3A shows a schematic diagram of a switch 300 implemented with an N-channel MOS (NMOS) transistor 310. NMOS transistor 310 has its source receiving an input signal ($V_{IN}$), its gate receiving a control signal ($V_{CONTROL}$), and its drain providing an output signal ($V_{OUT}$). Ideally, NMOS transistor 310 should pass the $V_{IN}$ signal when it is turned on and should block the $V_{IN}$ signal when it is turned off. However, NMOS transistor 310 has parasitic gate-to-source capacitance ($C_{GS}$) as well as parasitic gate-to-drain capacitance ($C_{GD}$). When NMOS transistor 310 is turned on, a portion of the $V_{IN}$ signal passes through a leakage path via the $C_{GS}$ and $C_{GD}$ capacitances to the $V_{CONTROL}$ signal source, which may have a low impedance. Signal loss through the $C_{GS}$ and $C_{GD}$ capacitances may be significant, especially for RF applications. For simplicity, other parasitic capacitances may be assumed to be negligible. For example, the source-to-bulk, source-to-substrate, drain to-bulk, and drain-to-substrate parasitic capacitances may be assumed to be negligible, or their effects may be mitigated.

Figure 3B:
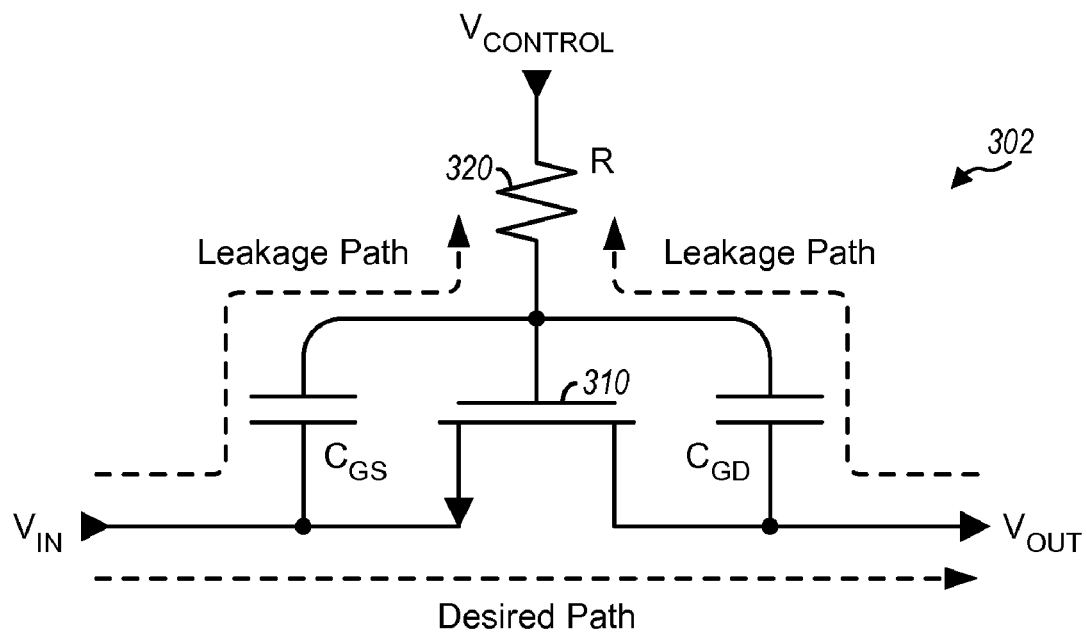

FIG. 3B shows a schematic diagram of a switch 302 implemented with NMOS transistor 310 having an RF floated gate. NMOS transistor 310 has its source receiving the $V_{IN}$ signal, its gate coupled to one end of a resistor 320, and its drain providing the $V_{OUT}$ signal. The other end of resistor 320 receives the $V_{CONTROL}$ signal. Resistor 320 has a resistance of R, which may be a relatively large value, e.g., in the kilo Ohm (kΩ) range. When NMOS transistor 310 is turned on, the leakage path is via the $C_{GS}$ and $C_{GD}$ capacitances as well as resistor 320 to the $V_{CONTROL}$ signal source. The high resistance of resistor 320 may essentially float the gate of NMOS transistor 310 at RF frequency, which may then reduce signal loss. Resistor 320 may be referred to as an RF floating resistor.

The $V_{IN}$ signal may have a large signal swing, which may exceed a breakdown voltage of NMOS transistor 310. When NMOS transistor 310 is turned off, the gate may be at a particular voltage (e.g., 0V), and the source may observe the signal swing of the $V_{IN}$ signal. The gate-to-source voltage ($V_{GS}$) may be dependent on the signal swing of the $V_{IN}$ signal and may exceed the breakdown voltage of NMOS transistor 310. The reliability of NMOS transistor 310 may be compromised when the $V_{GS}$ voltage exceeds the breakdown voltage.

Figure 4:
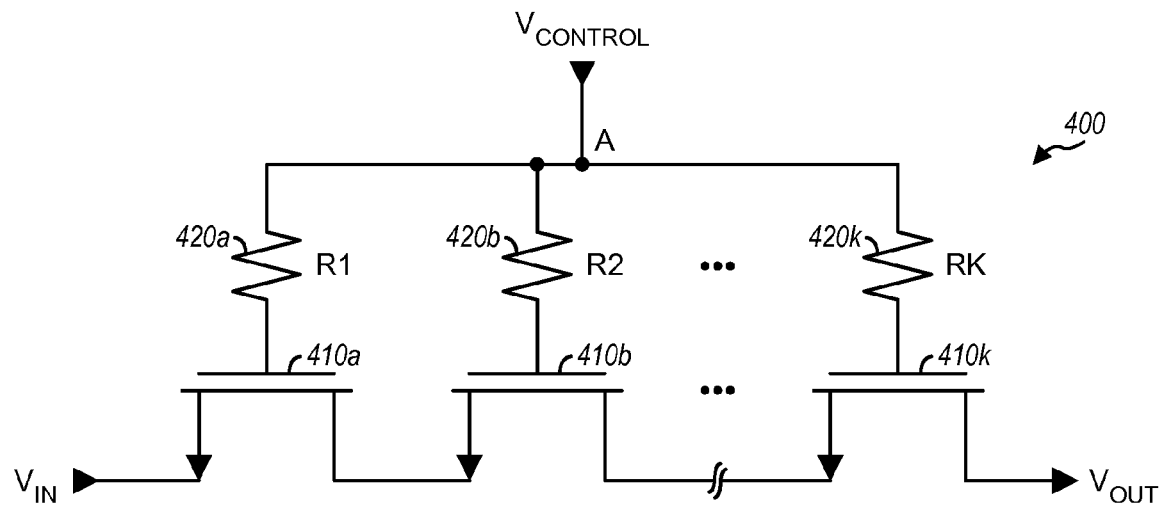
FIG. 4 shows a switch implemented with stacked MOS transistors.

FIG. 4 shows a schematic diagram of a switch 400 implemented with stacked NMOS transistors to improve reliability. Within switch 400, K NMOS transistors 410a through 410k are coupled in a stacked configuration (or in series), where K may be any integer value greater than one. Each NMOS transistor 410 (except for the first NMOS transistor 410a) has its source coupled to the drain of a preceding NMOS transistor. The first NMOS transistor 410a has its source receiving the $V_{IN}$ signal, and the last NMOS transistor 410k has its drain providing the $V_{OUT}$ signal. Each NMOS transistor 410 may be implemented with a symmetric structure, and the source and drain of each NMOS transistor may be interchangeable. K resistors 420a through 420k have one end coupled to node A and the other end coupled to the gate of NMOS transistors 410a through 410k, respectively. The $V_{CONTROL}$ signal is applied to node A.

Resistors 420a through 420k may have resistor values of R1 through RK, respectively, which may be relatively large values, e.g., in the kΩ range. When NMOS transistors 410 are turned on, resistors 420 may reduce signal loss by presenting a large resistance to the $V_{IN}$ signal in the leakage path through the $C_{GS}$ and $C_{GD}$ capacitances of each NMOS transistor. When NMOS transistors 410 are turned off, resistors 420 may help to distribute the voltage swing of the $V_{IN}$ signal approximately evenly across the K NMOS transistors 410 in the stack. If resistors 420 are not present, then the gates of NMOS transistors 410 may be at a low impedance when the NMOS transistors are turned off. The first NMOS transistor 410a may then observe most of the voltage swing of the $V_{IN}$ signal and may be more susceptible to reliability issues.

In general, reliability may be an issue in the following cases:

1. A multipath switch configuration in which all switches are connected to a common node, e.g., node N9 in FIG. 2. Typically, only one switch is turned on while all other switches are turned off, and
2. A shunt/through configuration in which a shunt switch is turned off while the through switch is turned on.

In the two cases above, a switch that is turned off may have one terminal coupled to a fixed voltage (e.g., circuit ground) while the other terminal may be connected to an RF signal. The switch may then observe a large signal swing, e.g., several Volts.

A switch may be implemented with stacked transistors, e.g., as shown in FIG. 4. If the transistors are large enough and if the gate and bulk terminals are RF floating (e.g., isolated through sufficiently large resistors), then the voltage swing may be split/distribute approximately equally across the transistors. However, if the transistors are small, then the impedance of the parasitic capacitors may be comparable to the resistors used to RF float the gate and bulk terminals. In this case, the resistors should have larger values in order to ensure proper splitting of the signal swing across the transistors.

Figure 5:
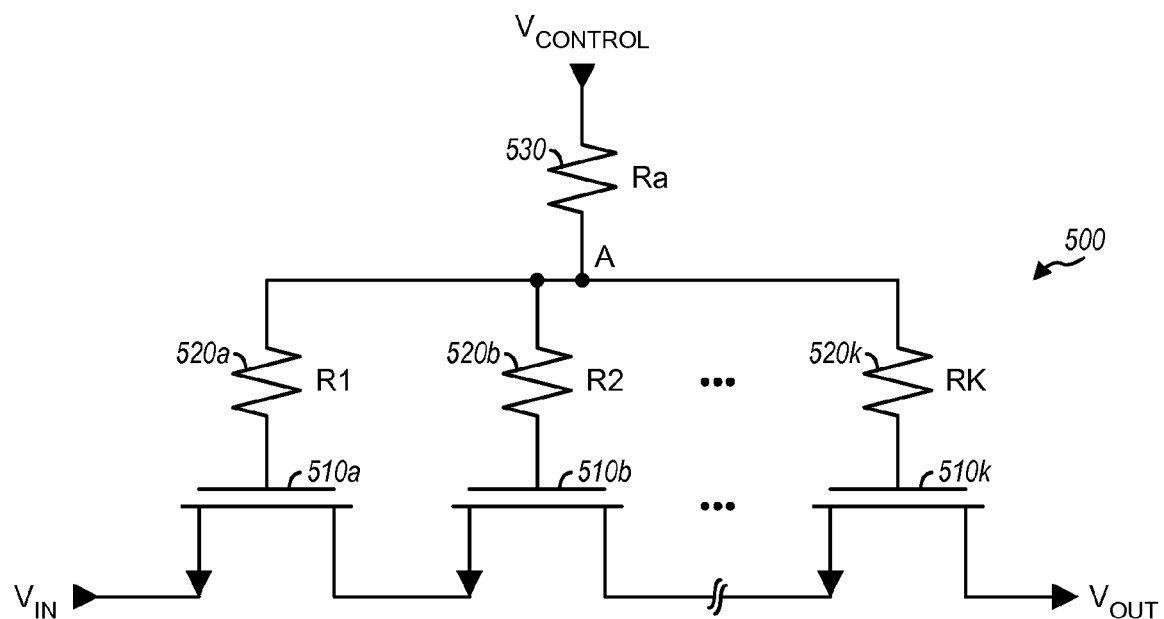
FIGS. 5 and 6 show two exemplary designs of a switch with improved biasing.

FIG. 5 shows a schematic diagram of an exemplary design of a switch 500 with improved biasing. Switch 500 is implemented with stacked NMOS transistors and an additional RF floating resistor to improve reliability. For switch 500, K NMOS transistors 510a through 510k and K resistors 520a through 520k are coupled in similar manner as K NMOS transistors 410a through 410k and K resistors 420a through 420k in FIG. 4. An additional resistor 530 has one end coupled to node A and the other end receiving the $V_{CONTROL}$ signal.

Resistors 520a through 520k may have resistor values of R1 through RK, respectively, and resistor 530 may have a resistor value of Ra. In one exemplary design, all resistors 520 and 530 have the same value, so that R1=R2=...=RK=Ra. In another exemplary design, resistors 520 have the same value, and resistor 530 has a different value, so that R1=R2=...=RK≠Ra. In yet another exemplary design, resistors 520 and 530 have different values.

The switch topology shown in FIG. 5, with additional RF floating resistor 530, may provide various advantages. First, better isolation from the $V_{IN}$ input to the $V_{CONTROL}$ input (i.e., less RF coupling through digital) may be achieved with resistor 530, since the impedance is boosted by the value of resistor 530. The higher impedance may also allow for use of smaller capacitors on the $V_{CONTROL}$ signal to filter out digital noise that might couple from the $V_{CONTROL}$ input to the RF input. Second, certain performance metrics may be better with the switch topology shown in FIG. 5 versus the switch topology shown in FIG. 4 with comparable resistance, e.g., twice the resistance. For example, insertion loss for switch 500 in FIG. 5 with all resistors having a value of R may be lower than insertion loss for switch 400 in FIG. 4 with all resistors having a value of 2R. The input impedance for switch 500 with all resistors having a value of R may be higher than the input impedance for switch 400 with all resistors having a value of 2R. Switch 500 with all resistors having a value of R may have better linearity (e.g., lower second and third order harmonics) than switch 400 with all resistors having a value of 2R. The switch topology in FIG. 5 may provide other advantages.

Figure 6:
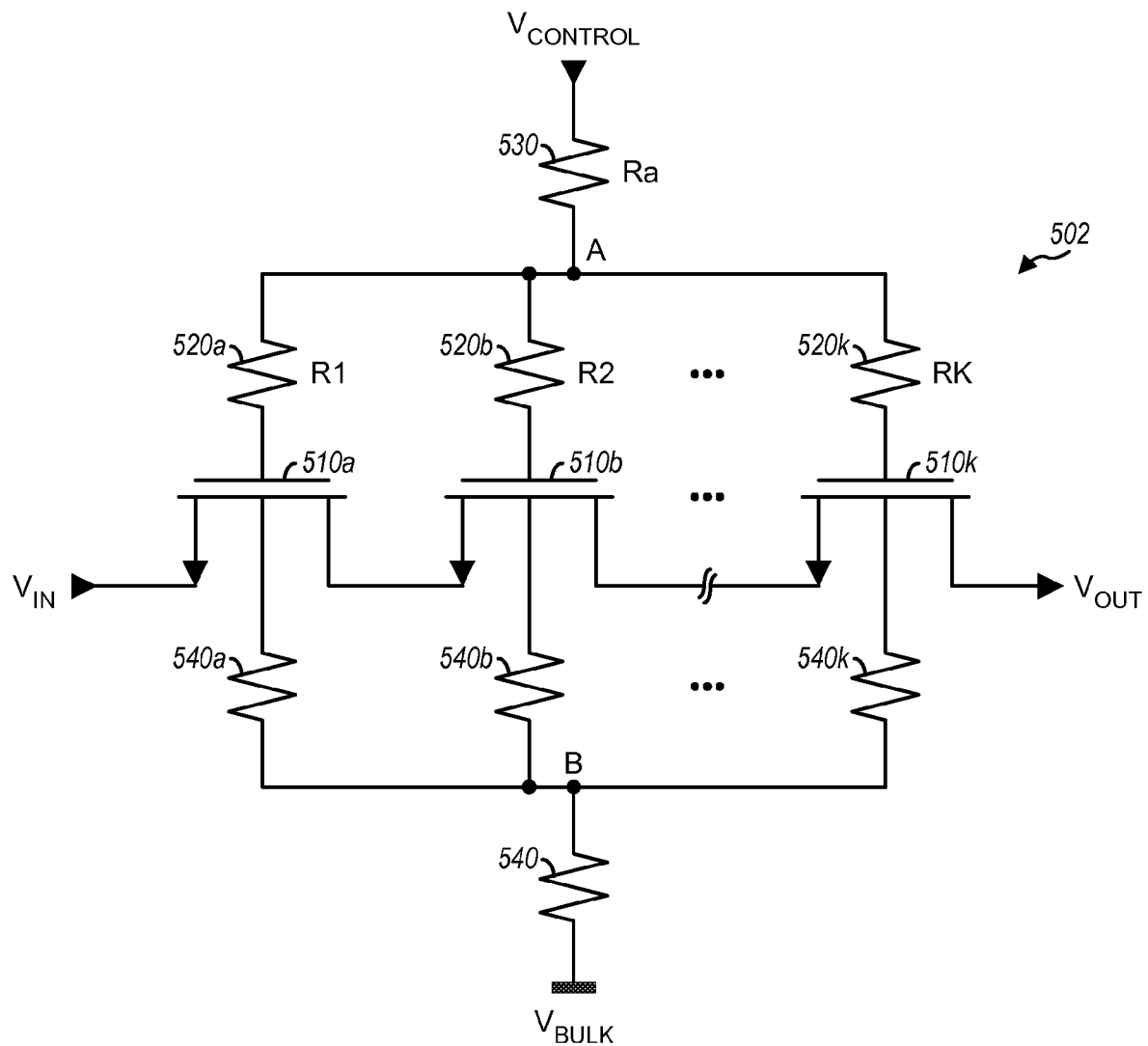

FIG. 6 shows a schematic diagram of an exemplary design of a switch 502 with improved biasing. Switch 502 is also implemented with stacked NMOS transistors and additional RF floating resistors. Switch 502 includes K MOS transistors 510a through 510k, K resistors 520a through 520k, and resistor 530, which are coupled as described above for FIG. 5. Switch 502 further includes K resistors 540a through 540k having one end coupled to node B and the other end coupled to the bulk nodes of NMOS transistors 510a through 510k, respectively. A resistor 550 is coupled between node B and a bulk voltage ($V_{BULK}$). The $V_{BULK}$ voltage may be alternating current (AC) ground (0V), a voltage lower than the DC voltage of the $V_{IN}$ signal, or some other voltage. Resistors 540 and 550 provide RF float for the bulk nodes of NMOS transistors 510, which may provide benefits similar to those obtained with resistors 520 and 530 to RF float the gates of NMOS transistors 510.

FIGS. 5 and 6 show exemplary designs of switches 500 and 502 with improved biasing and implemented with NMOS transistors. Switches with improved biasing may also be implemented with P-channel MOS (PMOS) transistors, complementary metal oxide semiconductor (CMOS) transistors, junction transistors (BJTs), bipolar-CMOS (BiCMOS) transistors, silicon germanium (SiGe) transistors, gallium arsenide (GaAs) transistors, etc.

In an exemplary design, an apparatus may comprise a plurality of transistors, a plurality of resistors, and an additional resistor, e.g., as shown in FIG. 5. The plurality of transistors (e.g., NMOS transistors 510) may be coupled in a stacked configuration, may receive an input signal, and may provide an output signal. The plurality of resistors (e.g., resistors 520) may be coupled to the gates of the plurality of transistors. The additional resistor (e.g., resistor 530) may be coupled to the plurality of resistors and may receive a control signal for the plurality of transistors.

The plurality of transistors may comprise MOS transistors, NMOS transistors, PMOS transistors, etc. The plurality of resistors may have equal resistor value or different resistor values. The additional resistor may have the same or different resistor value as the plurality of resistors. In an exemplary design, each resistor may have a value of at least one kΩ.

The plurality of resistors and the additional resistor may reduce signal loss through parasitic capacitances of the plurality of transistors when they are turned on. The input signal may have a larger signal swing than the breakdown voltage of each transistor. The plurality of resistors and the additional resistor may help split the signal swing approximately evenly across the plurality of transistors when they are turned off. The resistors may also improve switching performance, as described above.

The apparatus may further include a second plurality of resistors and a second additional resistor, e.g., as shown in FIG. 6. The second plurality of resistors (e.g., resistors 540) may be coupled to the bulk nodes of the plurality of transistors. The second additional resistor (e.g., resistor 550) may be coupled to the second plurality of resistors and a bulk voltage, e.g., AC ground.

The apparatus may further include a power amplifier to provide an amplified RF signal. The input signal may be an RF signal that may be derived based on the amplified RF signal.

In another exemplary design, an integrated circuit may comprise a plurality of MOS transistors, a plurality of resistors, and an additional resistor. The plurality of MOS transistors may be coupled in a stacked configuration, may receive an input RF signal, and may provide an output RF signal. The plurality of resistors may be coupled to the gates of the plurality of MOS transistors. The additional resistor may be coupled to the plurality of resistors and may receive a control signal for the plurality of MOS transistors. The integrated circuit may further comprise (i) a second plurality of resistors coupled to the bulk nodes of the plurality of MOS transistors and (ii) a second additional resistor coupled to the second plurality of resistors and a bulk voltage.

In yet another exemplary design, an apparatus (e.g., a wireless communication device) may comprise a module. The module may comprise multiple switches to implement multiple signal paths. The module may receive an RF signal and may route the RF signal via one of the multiple signal paths. Each switch may comprise a plurality of transistors coupled in a stacked configuration, a plurality of resistors coupled to the gates of the plurality of transistors, and an additional resistor coupled to the plurality of resistors and receiving a control signal for the plurality of transistors. In an exemplary design, the module may be a switchplexer, e.g., switchplexer 260 in FIG. 2. In another exemplary design, the module may be a PA module that may further comprise at least one power amplifier to amplify the RF signal when enabled. The module may also be some other unit with multiple signal paths.

Figure 7:
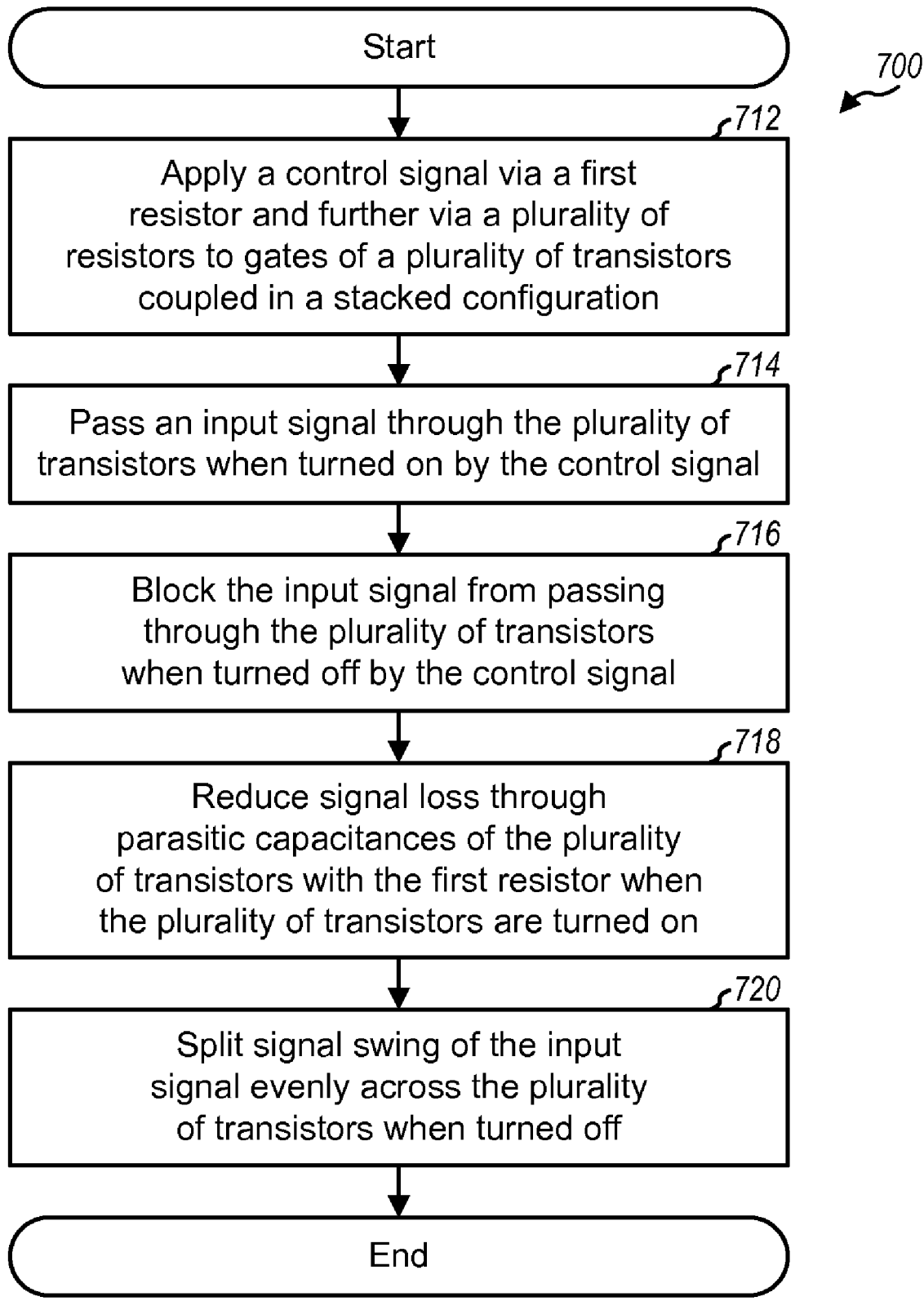
FIG. 7 shows a process for performing signal switching.

FIG. 7 shows an exemplary design of a process 700 for performing signal switching. A control signal may be applied via a first resistor and further via a plurality of resistors to the gates of a plurality of transistors coupled in a stacked configuration (block 712). An input signal may be passed through the plurality of transistors when they are turned on by the control signal (block 714). The input signal may be blocked from passing through the plurality of transistors when they are turned off by the control signal (block 716). Signal loss through parasitic capacitances of the plurality of transistors may be reduced with the first resistor when the plurality of transistors are turned on (block 718). Signal swing of the input signal may be split approximately evenly across the plurality of transistors when they are turned off (block 720).

The switches with improved biasing described herein may be implemented on an IC, an analog IC, an RFIC, a mixed-signal IC, an ASIC, a printed circuit board (PCB), an electronics device, etc. The switch may also be fabricated with various IC process technologies such as CMOS, NMOS, PMOS, BJT, BiCMOS, SiGe, GaAs, etc. The switches may also be fabricated with silicon-on-insulator (SOI), which is an IC process in which a thin layer of silicon is formed on top of an insulator such as silicon oxide or glass. MOS transistors for a switch may then be built on top of this thin layer of silicon. The SOI process may reduce parasitic capacitances of the switch, which may be able to operate faster.

An apparatus implementing the switches with improved biasing described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a plurality of transistors coupled in a stacked configuration and to receive an input signal and provide an output signal;
   a plurality of resistors coupled to gates of the plurality of transistors;
   an additional resistor coupled to the plurality of resistors and to receive a control signal for the plurality of transistors;
   a second plurality of resistors coupled to bulk nodes of each of the plurality of transistors; and
   a second additional resistor coupled between each resistor of the second plurality of resistors and a bulk voltage.

2. The apparatus of claim 1, the plurality of transistors comprise metal oxide semiconductor (MOS) transistors.

3. The apparatus of claim 1, the plurality of transistors comprise N-channel metal oxide semiconductor (NMOS) transistors.

4. The apparatus of claim 1, the plurality of resistors have equal resistor value.

5. The apparatus of claim 1, the plurality of resistors and the additional resistor have equal resistor value.

6. The apparatus of claim 1, the plurality of resistors each has a first resistor value, and the additional resistor has a second resistor value different from the first resistor value.

7. The apparatus of claim 1, the plurality of resistors and the additional resistor each has a value of at least one kilo Ohm.

8. The apparatus of claim 1, the bulk voltage is alternating current (AC) ground or a bias voltage lower than a direct current (DC) voltage of the input signal.

9. The apparatus of claim 1, the input signal comprises an input radio frequency (RF) signal, and the output signal comprises an output RF signal.

10. The apparatus of claim 9, further comprising:
    a power amplifier to provide an amplified RF signal, and the input RF signal is derived based on the amplified RF signal.

11. The apparatus of claim 1, the input signal has a larger signal swing than a breakdown voltage of each transistor.

12. An integrated circuit comprising:
    a plurality of metal oxide semiconductor (MOS) transistors coupled in a stacked configuration and to receive an input radio frequency (RF) signal and provide an output RF signal;
    a plurality of resistors coupled to gates of the plurality of MOS transistors;
    an additional resistor coupled to the plurality of resistors and to receive a control signal for the plurality of MOS transistors;
    a second plurality of resistors coupled to bulk nodes of each of the plurality of MOS transistors; and
    a second additional resistor coupled between each resistor of the second plurality of resistors and a bulk voltage.

13. An apparatus comprising:
a module comprising multiple switches to implement multiple signal paths, the module receives a radio frequency (RF) signal and routes the RF signal via one of the multiple signal paths, each of the multiple switches comprising
a plurality of transistors coupled in a stacked configuration,
a plurality of resistors coupled to gates of the plurality of transistors,
an additional resistor coupled to the plurality of resistors and to receive a control signal for the plurality of transistors;
a second plurality of resistors coupled to bulk nodes of each of the plurality of transistors; and
a second additional resistor coupled between each resistor of the second plurality of resistors and a bulk voltage.

14. The apparatus of claim 13, the module is a switchplexer coupled to an antenna.

15. The apparatus of claim 13, the module is a power amplifier (PA) module further comprising at least one power amplifier to amplify the RF signal.

16. The apparatus of claim 13, the apparatus is a wireless communication device.

17. A method of performing signal switching, comprising:
applying a control signal via a first resistor and further via a plurality of resistors to gates of a plurality of transistors coupled in a stacked configuration;
passing an input signal through the plurality of transistors when turned on by the control signal;
blocking the input signal from passing through the plurality of transistors when turned off by the control signal; and
biasing a bulk node of each transistor of the plurality of transistors with a bulk voltage via a second additional resistor coupled to the bulk voltage and further via a second plurality of additional resistors, each additional resistor of the second plurality of additional resistors coupled between the second additional resistor and a bulk node of a transistor of the plurality of transistors.

18. The method of claim 17, further comprising:
reducing signal loss through parasitic capacitances of the plurality of transistors with the first resistor when the plurality of transistors are turned on.

19. The method of claim 17, further comprising:
splitting signal swing of the input signal evenly across the plurality of transistors when turned off.

20. An apparatus comprising:
means for passing an input signal when turned on by a control signal and for blocking the input signal when turned off by the control signal;
means for applying the control signal via a first resistor and further via a plurality of resistors to the means for passing and blocking the input signal; and
means for biasing the means for passing and blocking the input signal with a voltage via a second resistor coupled to the voltage and further via a second plurality of additional resistors, each additional resistor of the second plurality of additional resistors coupled between the second additional resistor and the means for passing and blocking the input signal.

* * * * *